US007258012B2

(12) United States Patent
Xie

(10) Patent No.: US 7,258,012 B2
(45) Date of Patent: Aug. 21, 2007

(54) INTEGRATED MONOLITHIC TRI-AXIAL MICROMACHINED ACCELEROMETER

(75) Inventor: Huikai Xie, Gainesville, FL (US)

(73) Assignee: University of Florida Research Foundation, Inc., Gainesville, FL (US)

( * ) Notice: Subject to any disclaimer, the term of this patent is extended or adjusted under 35 U.S.C. 154(b) by 0 days.

(21) Appl. No.: 11/363,293

(22) Filed: Feb. 21, 2006

(65) Prior Publication Data

US 2006/0260401 A1  Nov. 23, 2006

Related U.S. Application Data

(63) Continuation of application No. 10/786,787, filed on Feb. 24, 2004, now abandoned.

(60) Provisional application No. 60/449,745, filed on Feb. 24, 2003.

(51) Int. Cl.
*G01P 15/125* (2006.01)
(52) U.S. Cl. .................. 73/514.32; 73/510; 73/514.01; 73/514.16
(58) Field of Classification Search ................ 73/510, 73/514.32
See application file for complete search history.

(56) References Cited

U.S. PATENT DOCUMENTS

| 4,711,128 A * | 12/1987 | Boura ...................... 73/514.18 |
|---|---|---|
| 5,501,893 A | 3/1996 | Laermer et al. |
| 5,707,077 A | 1/1998 | Koide et al. |
| 5,717,631 A | 2/1998 | Carley et al. |
| 5,719,073 A | 2/1998 | Shaw et al. |
| 5,747,353 A | 5/1998 | Bashir et al. |
| 5,767,405 A * | 6/1998 | Bernstein et al. ........ 73/504.16 |
| 5,970,315 A | 10/1999 | Carley et al. |
| 6,000,280 A * | 12/1999 | Miller et al. ................... 73/105 |
| 6,088,907 A | 7/2000 | Lee et al. |
| 6,214,633 B1 | 4/2001 | Clark et al. |
| 6,433,401 B1 * | 8/2002 | Clark et al. ................. 257/524 |
| 6,458,615 B1 | 10/2002 | Fedder et al. |
| 6,681,063 B1 | 1/2004 | Kane et al. |
| 6,737,648 B2 | 5/2004 | Fedder et al. |
| 6,938,484 B2 * | 9/2005 | Najafi et al. ............. 73/514.32 |
| 2004/0166688 A1 | 8/2004 | Xie et al. |
| 2004/0182155 A1 * | 9/2004 | Najafi et al. ............. 73/514.32 |
| 2004/0195096 A1 | 10/2004 | Tsamis et al. |

FOREIGN PATENT DOCUMENTS

WO    WO 02/43148 A2    5/2002

OTHER PUBLICATIONS

Xie et al., "Post-CMOS Processing for High-Aspect-Ratio Integrated Silicon Microstructures," Journal of Microelectromechanical Systems, 11:93-101, 2002.
Lemkin et al., "A 3-Axis Force Balanced Accelerometer Using a Single Proof-Mass," 1997 International Conference on Solid-State Sensors And Actuators. Digest of Technical Papers. Transducers 97,2:1185-1188, 1997.

(Continued)

*Primary Examiner*—Hezron Williams
*Assistant Examiner*—Samir M. Shah
(74) *Attorney, Agent, or Firm*—Akerman Senterfitt

(57) ABSTRACT

A monolithic integrated 3-axis accelerometer chip includes a single crystal substrate, the substrate including at least one single crystal membrane layer portion. A single sensor microstructure made from the single crystal membrane senses acceleration in each of the three orthogonal directions. At least one electronic circuit can also be disposed on the chip, such as a circuit for driving, detecting, controlling and signal processing.

12 Claims, 8 Drawing Sheets

OTHER PUBLICATIONS

Xie et al. "A DRIE CMOS-MEMS Gyroscope", IEEE Seonsors 2002 Conference, 2002, pp. 1413-1418.

Xie et al. "A CMOS-MEMS Lateral-axis Gyroscope", Technical Digest of the 14th IEEE International Conference on Micro Electro Mechanical Systems (MEMS '01), 2001, pp. 162-165.

Xie et al. "Simulation and Characterization of a CMOS Z-axis Microactuator with Eelctrostatic Combo Drives", Proc. of the 2000 Int. Conf. on Modeling and Simulation of Microsystems Semiconductors, Sensors and Actuators (MSM '00), 2000.

Xie et al. "Verticle Comb-Finger Capacitive Actuator and Sensing of CMOS-MEMS", Sensors and Actuators, 2002, 95(2-3):212-221.

Qu et al. "A Single-Crystal Silicon 3-Axis CMOS-MEMS Accelerometer", IEEE Seonsors, 2004.

Lemkin et al. "A 3-Axis Surface Machined Sigma Delta Accelerometer", Technical Digest of 1997 IEEE International Solid-State Circuits Conference, pp. 202-203.

Chae et al. "A Monolithic 3-Axis Silicon Capacitive Accelerometer with Micro-g Resolution", The Proceedings of the 12th International Conference Solid-State Sensors, Actuators and Microsystems, 2003.

Xie "Gyroscope and Micromirror design Using Vertical-Axis CMOS-MEMS Actuation and Sensing," Ph.D. Thesis, Camegie Mellon University, 2002.

Xie et al. "Endoscopic optical coherence tomographic imaging with a CMOS-MEMS micromirror", Sensor and Actuators A 103, 2003, pp. 237-241.

Xie et al. "A CMOS Z-Axis Capacitive Accelerometer with Comb-Finger Sensing", The 13th Annual International Micro Electro Mechanical Systems Conference, MEMS, 2000, pp. 496-501.

Xie et al. "Design and fabrication of an integrated CMOS-MEMS 3-axis accelerometer", The 2003 Nanotechology Conference and Trade Show, pp. 292-295.

* cited by examiner

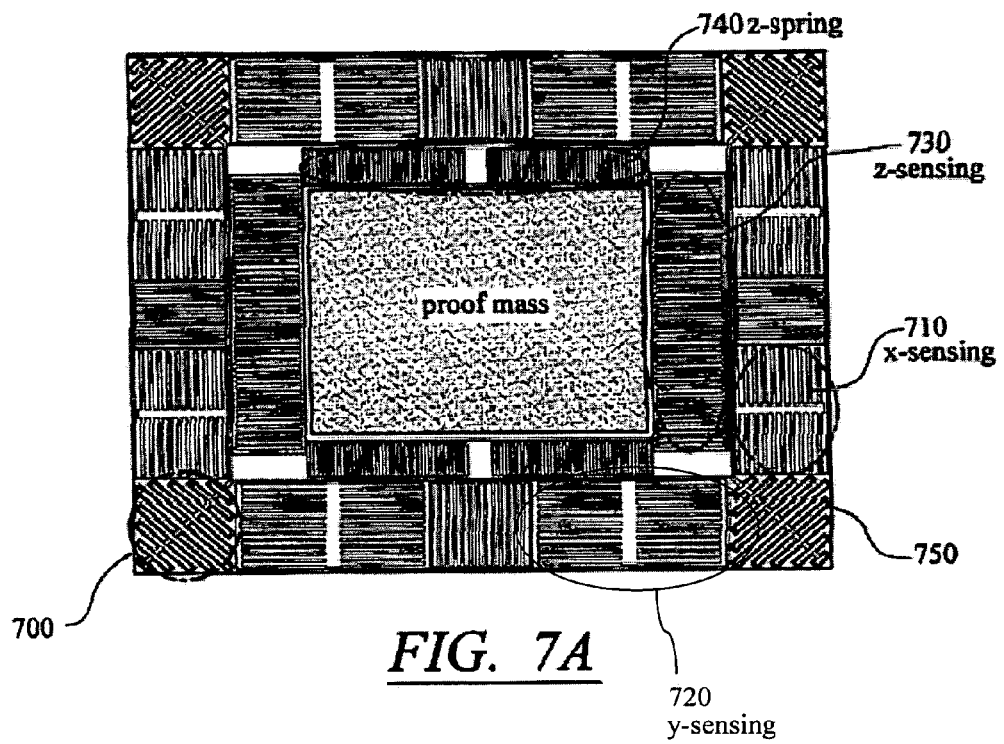
FIG. 7A
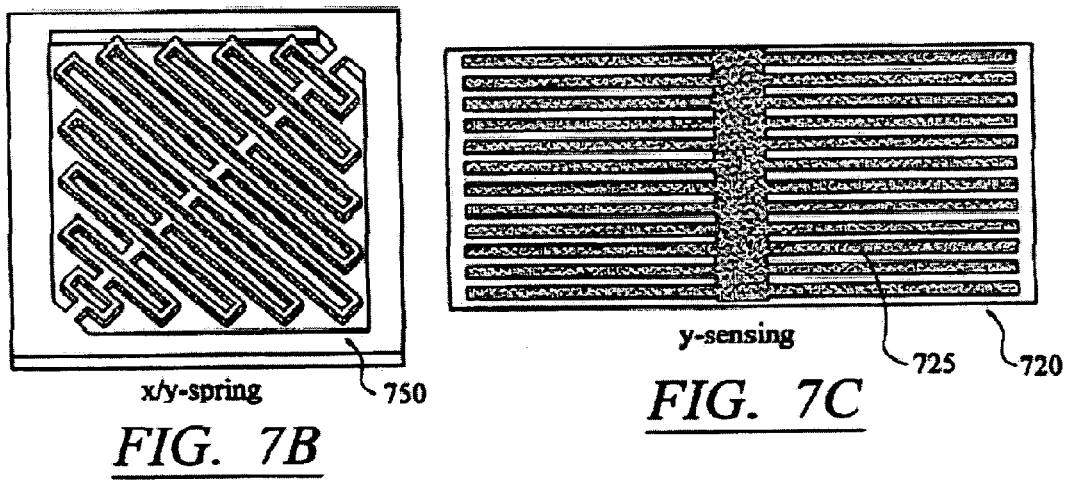
FIG. 7B
FIG. 7C

INTEGRATED MONOLITHIC TRI-AXIAL MICROMACHINED ACCELEROMETER

CROSS-REFERENCE TO RELATED APPLICATIONS

This application is a continuation of U.S. patent application Ser. No. 10/786,787 now abandoned entitled "INTEGRATED MONOLITHIC TRI-AXIAL MICROMACHINED ACCELEROMETER" filed on Feb. 24, 2004, which claims the benefit of U.S. Provisional Application No. 60/449,745 entitled "INTEGRATED MONOLITHIC TRI-AXIAL MICROMACHINED ACCELEROMETER" filed on Feb. 24, 2003, the entirety of which is incorporated herein by reference.

STATEMENT REGARDING FEDERALLY SPONSORED RESEARCH OR DEVELOPMENT

The United States Government has rights in this invention pursuant to Agreements No. F30602-99-2-0545 and F30602-97-2-0323 between DARPA and Carnegie Mellon University.

FIELD OF THE INVENTION

The invention relates to sensors, and more particularly to monolithic integrated MEMS sensors.

BACKGROUND

Micromachined devices fabricated by complementary metal-oxide-semiconductor (CMOS)-compatible fabrication processes are attractive because of the ability to integrate high-performance on-chip signal conditioning circuits with sensing elements, expected multivendor accessibility and short design cycle times. Currently, most CMOS-compatible micromachining processes are polysilicon or polycrystalline silicon/germanium surface micromachining process based which use silicon dioxide as the sacrificial material and typically involve a wet etch step for releasing the micromechanical structures. Even though HF vapor can be used for release, protection of integrated circuits and sticking problems during release still remain major concerns.

Wiring on a single polysilicon microstructure is constrained to one electrode for each continuous microstructure which limits the design flexibility for electrostatic actuators and capacitive sensors. Moreover, the relatively large parasitic capacitance in polysilicon processes degrades performance of capacitive sensor designs. For example, a 50-finger comb drive with 30 µm overlap in the MUMP's polysilicon process has about 28 fF of sensing capacitance. The parasitic capacitance is 13 fF due to the fingers alone, 14 aF/µm from interconnect and 1.1 pF for a standard 78 µm by 78 µm square bond pad. Bond-wire or solder-bump connection to external electronics contributes additional parasitic capacitance.

Miniature three-axis accelerometers are often required in automobiles, navigation systems and for some medical applications, such for use with hemiplegic patients. There are two types of micromachining processes, surface micromachining and bulk micromachining. Most existing micromachined accelerometers are uni-axial or dual-axial and fabricated using surface micromachining processes.

In general, bulk micromachining creates large proof mass and is suitable for making z-axis accelerometers with capacitive parallel plates or piezoresistive beams. However, typically no CMOS circuitry is integrated on the sensor chip. Surface micromachining, on the other hand, can be compatible with CMOS processes and is suitable for fabricating lateral-axis accelerometers with capacitive interdigitated comb fingers. By assembling and orienting orthogonally two or three separate accelerometers, tri-axial acceleration sensing systems can be obtained, but both the package size and cost is high.

Some 3-axis accelerometers have been reported. Among them, bulk micromachined 3-axis accelerometers generally have large mass, but require wafer bonding, wet etching and two-side alignment. Surface micromachined tri-axial accelerometers can have integrated interface circuitry, but have small mass.

Lemkin et al. discloses a surface micromachined 3-axis accelerometer [Lemkin, et al. "A 3-Axis Force Balanced Accelerometer Using a Single Proof-Mass" Transducers '97, 1997 International Conference on Solid-State Sensors and Actuators, Chicago, Jun. 16-19, 1997, pgs. 1185-1188]. Lerikin's accelerometer uses single-crystal silicon as the substrate material, but the sensor microstructures are made of thin-film polysilicon. The x- and y-axis sensing elements disclosed by Lemkin are comb fingers, while the z-axis sensing capacitance is formed as a parallel plate pair between the proof mass and a ground polysilicon layer on the substrate. Thus, a separate fixed capacitor is used to realize a differential capacitive bridge for z-axis sensing. Significantly, the inherent large parasitic capacitance greatly reduces the obtainable signal-to-noise ratio. The residual stress of the thin-film materials also limits the size of the proof mass which limits the obtainable resolution of the Lemkin's accelerometer.

SUMMARY OF THE INVENTION

A monolithic integrated 3-axis accelerometer sensor "chip" includes a single crystal substrate, the substrate including at least one single crystal membrane layer portion. The membrane layer is thin as compared to the nominal thickness of the single crystal substrate. A single sensor microstructure based on capacitive sensing is formed using the membrane layer and senses acceleration in each of the three orthogonal directions (x, y and z). In one embodiment, all components comprising the sensor microstructure utilize the membrane layer.

As used above, the term "integrated" has a two-fold meaning. First, the 3-axis acceleration sensor is integrated on the single chip. Second, the sensor, and in a preferred embodiment electrical circuitry such as signal conditioning electronics, are also integrated on the chip. Although referred to as an acceleration sensor, the sensor is more broadly a motion sensor or a vibration sensor. The chip can also be used as a tilt sensor.

At least one interface electronic circuit is preferably provided on the chip for processing the sensor data. The sensor microstructure preferably utilizes comb finger sets, at least one comb finger set for sensing movement in one of the three orthogonal axes. The interface circuit can include a pre-amplifier, a demodulator, a low-pass filter, an A/D converter and/or a digital signal processor (DSP). The single crystal substrate can be used to provide at least one electrode. The single crystal membrane layer is preferably less than about 100 µm thick, such as 60 µm, 50 µm, or 40 µm.

The accelerometer can include a single proof mass, and the electronic circuit can be disposed on top of the proof mass. The comb finger sets for both x-sensing and y-sensing can provide fully differential capacitive bridges. The respective comb finger sets are preferably electrically isolated from one another and to other portions of chip.

The accelerometer can include a rigid frame for decoupling x-y sensing from z-sensing. In one embodiment, the structure for z-sensing can be disposed inside the rigid frame, wherein the frame together with said z-sensing structure is the effective proof mass for x-y sensing. The structure for x-y sensing can be disposed inside the frame, wherein the frame plus the x-y sensing structure is the effective proof mass for z-sensing.

The accelerometer chip can include differential z-axis capacitive sensing using sidewall capacitors formed by CMOS layers and the single crystal substrate. The single crystal substrate can comprise silicon and the electronic circuit comprises CMOS circuitry. A transceiver and integrated antenna may also be provided on chip to permit communications between the accelerometer chip and a remotely located system.

BRIEF DESCRIPTION OF THE DRAWINGS

A fuller understanding of the present invention and the features and benefits thereof will be accomplished upon review of the following detailed description together with the accompanying drawings, in which:

FIGS. 1(A)-(C) illustrate cross sections of intermediate structures, while FIG. 1(D) illustrates the cross section of a final monolithic integrated single crystal silicon (SCS) 3-axis accelerometer structure according to an embodiment of the invention, obtained using a DRIE CMOS-MEMS process.

FIG. 4(A) illustrates a z-axis spring design, according to another embodiment of the invention.

FIG. 4(B) illustrates a top view of x-y springs including a central plate, according to an embodiment of the invention.

FIG. 7(A) is a micrograph of a released three axis accelerometer; FIG. 7(B) is a micrograph of an x-y spring from the accelerometer, while FIG. 7(C) is a micrograph of y sensing comb fingers from the accelerometer, all according to embodiments of the invention.

DETAILED DESCRIPTION OF THE INVENTION

Figures 1A, 1B, 1C, 1D:
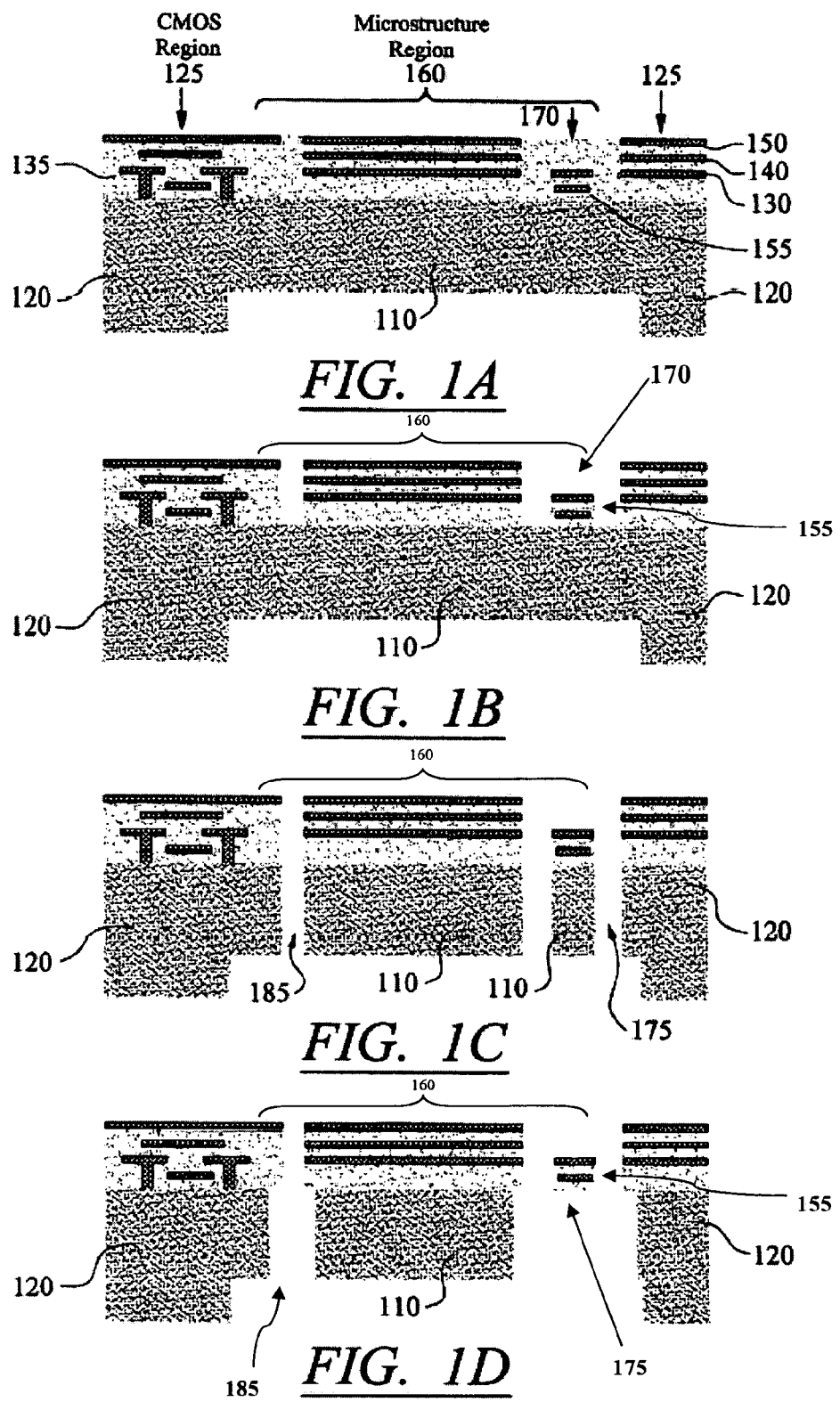

A monolithic integrated 3-axis accelerometer "chip" includes a single crystal substrate, the substrate including at least one single crystal membrane layer portion. The sensor microstructure uses capacitive sensing to sense acceleration in each of the three orthogonal directions and is formed using the single crystal membrane layer. At least one electronic circuit is preferably also formed on the chip. The single crystal substrate is preferably silicon based, but can be any single crystal substrate material which is compatible with integrated circuit processing, such as Si/Ge or GaAs. When single crystal silicon substrates are described, such substrates, or portions thereof, are referred to herein as single crystal silicon (SCS).

The electronic circuits provided on the chip can include a pre-amplifier, demodulator, low-pass filter, A/D converter and DSP. A transceiver and integrated on-chip antenna can also be integrated for applications requiring communications between a plurality of the system according to the invention or between a system according to the invention and a remotely located system. Thus, the invention can integrate a SCS based sensor microstructure with CMOS electronics on a single chip. Previous work has integrated electronics with sensor microstructures made of polysilicon or other polycrystalline thin-film materials.

The single-crystal based microstructures comprising the sensor system are preferably all made using the SCS membrane layer, except for one disclosed embodiment of z-axis sensing which includes z-axis compliant springs. Accordingly, the proof mass is made of SCS and can be advantageously much larger than polysilicon-based microstructures, such as Lemkin's. Inherent residual stresses in thin-film polysilicon processes limit the area and thickness of polysilicon proof mass to avoid device degradation or failure resulting from curling or buckling of the proof mass. Therefore, the larger proof mass provided by the invention generates a correspondingly larger inertia which results in much higher sensitivity and enables higher resolution. In addition, use of SCS based microstructures provides improved robustness and temperature performance over otherwise analogous polysilicon microstructures.

In a preferred 3-axis accelerometer embodiment, separate comb finger sets are provided for x, y and z-axis acceleration sensing. The invention also discloses a new and improved comb finger design for acceleration sensing. In a preferred embodiment, the comb fingers have a metal/dielectric composite thin film layer ("CMOS layer") on top and single-crystal silicon (SCS) membrane layer. The SCS layer preferably has a cut adjacent to the joint (or anchor) of the comb fingers, resulting in the SCS layer underlying each comb finger being electrically isolated from the rest of the SCS, and as a result, the comb fingers from one another. In one embodiment, the SCS layer is used as active electrodes.

Since the SCS membrane layer (e.g. 60 μm thick) is much thicker than CMOS layer disposed thereon (<5 μm), the resultant combs have much larger sensing capacitance. In addition, the parasitic capacitance of the microstructure is very small because there is no silicon substrate under the SCS membrane-based structures. Therefore, the signal-to-noise ratio is substantially improved.

The interface and sensor signal conditioning circuitry can be disposed on top of the proof mass. Placing the interface and signal conditioning circuitry on the proof mass can significantly reduce the chip size, which can reduce the cost of the monolithic sensor. The device can be fabricated by a post-CMOS micromachining process that utilizes only dry-etching and no extra masks, material deposition or wafer bonding. A noise floor of 1 μg/Hz$^{1/2}$ can be generally provided with a 2 mm by 2 mm device. A even lower noise floor is also achievable with a larger proof mass size and low-noise interface circuits.

The monolithic single-crystal based sensor can be formed using a deep reactive-ion-etch (DRIE) CMOS-MEMS process which can be implemented following standard CMOS processing during which interface and signal conditioning circuitry are also formed on-chip. The DRIE process is described in a paper by Xie et al., entitled "Post-CMOS Processing for High Aspect-Ratio Integrated Silicon Microstructures", Journal of Microelectromechanical Systems, Vol. 11, No. 2, April 2002 and U.S. Pat. No. 6,458,615 to Fedder et al. entitled "Method of Fabricating Micromachined Structures and Devices Formed Therefrom", both of which are hereby incorporated by reference in their entirety into this application. However, the invention is in no way limited to being formed using the DRIE CMOS-MEMS process.

An exemplary process flow, together with intermediate structures and a resulting exemplary accelerometer device according to the invention using the DRIE CMOS-MEMS process are shown in FIGS. 1(A)-(C), and FIG. 1(D), respectively. The CMOS wafer is etched from its back side, leaving a 10 to 100 μm-thick single-crystalline silicon (SCS) membrane layer 110 as shown in FIG. 1(A) in the region labeled as the microstructure region 160. Microstructure region 160 is where the sensors comprising the sensor microstructure will be formed. The Si thickness in the region labeled CMOS region 120 having one or more CMOS devices 125, such as signal conditioning electronics, remains that of the wafer starting material, typically at least about 500 μm. Three layers of metal are shown in FIG. 1(A), 150, 140 and 130, separated from each other and other conductive regions by an electrically insulating layer, such as silicon dioxide 135.

The CMOS region 125 can include interface circuitry such as pre-amplifiers, demodulators, low-pass filters, A/D converters and a DSP, which are communicably connected (e.g. metal traces) to the sensors provided in the microstructure region 180. In a preferred embodiment, the CMOS region 125 also includes a transceiver and integrated on-chip antenna to permit wireless transmission of sensor data from the accelerometer to one or more remote sites.

An optional polysilicon based region 170 is shown included within microstructure region 160. Region 170 includes metal layer 130 and polysilicon layer 155. The polysilicon layer 155 is typically only about 0.2 μm thick, thinner than typical oxide layers and (1 μm) and typical metal layers (0.8 μm).

Next, an anisotropic dielectric etch is performed from the front side using the top metal layers in the regions 125 and 160 as etch masks and results in the structure shown in FIG. 1(B). Then, in contrast to other processes, an anisotropic instead of an isotropic silicon etch, is used to etch portions of the SCS membrane 110 and release microstructures 155 and 170 to produce the structure shown in FIG. 1(C). A thick, stiff, single crystal layer 110 remains underneath the whole microstructure, resulting in a relatively flat released microstructure, especially when compared with multilayer thin-film CMOS-MEMS structures.

As used herein, the term "release" or the term "free" as applied to a microstructure refers to a microstructure portion which can move in one, two or even three directions. The release as described above is achieved by first forming a microstructure on top of a sacrificial layer, such as a silicon layer. After the sacrificial layer is removed, the microstructure is free to move. Although not shown, the microstructure is anchored to the substrate at one or more anchor points.

An optional isotropic timed Si etch step can be used to undercut the silicon comprising structures in region 160 to create z-compliant structures. As shown in FIG. 1(D), structure 175 which includes polysilicon layer 155 has the Si totally undercut (removed). The silicon undercut is small (<1 μm) so that the silicon in the CMOS region 120 will remain, as will SCS membrane 110 beneath microstructures 185 as shown in FIG. 1(D). This step provides both z-compliant structures and also achieves electrical isolation of the SCS membrane 110 between the respective sensing components comprising the microstructure.

Figure 2A:
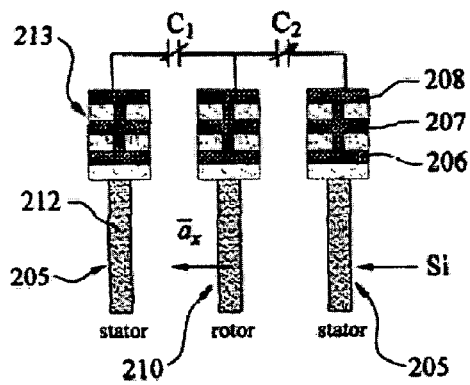
FIG. 2(A) illustrates a lateral axis comb finger sensor design, according to an embodiment of the invention.
Figure 2B:
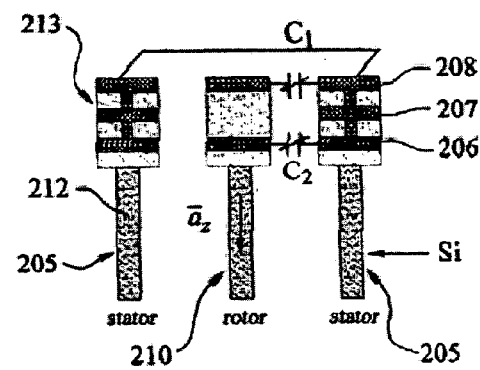
FIG. 2(B) illustrates a vertical axis comb finger sensor design, according to another embodiment of the invention.

Various comb designs according to the invention can be used to realize at least three comb sets on the same chip to provide capacitance-based acceleration sensing in the two lateral axes (x,y) as well as the vertical (z-axis), thus providing integrated full three axis sensing. The principle of lateral-axis and z-axis capacitive comb finger sensing is first illustrated in the cross sectional views shown in FIGS. 2(A) and 2(B), respectively. The SCS layer can be only a mechanical support layer as shown in FIGS. 2(A) and 2(B), or both a support and active electrode layer as shown in FIGS. 2(C) and 2(D).

SCS Layer as Mechanical Support Only

In this embodiment, the SCS membrane layer 212 comprising each finger is electrically isolated from the metal/dielectric stack 213 disposed on top of membrane layer 212. If the respective metal layers 206, 207 and 208 on stators 205 and rotor 210 are electrically connected, respectively, as shown in FIG. 2(A), the CMOS comb drive functions analogously to a conventional lateral-axis polysilicon comb drive. If all three metal layers 206-208 on the stators are electrically connected while the metal layers 206 and 208 on rotor 210 are separately connected as shown in FIG. 2(B), two sidewall capacitors, $C_1$ and $C_2$, will change values in opposite directions upon vertical (z-axis) movement of rotor 210. Because of the high wiring flexibility, a fully differential capacitive bridge can be easily formed. All the comb fingers shown in FIGS. 2(A) and (B) have a "T" shape cross-section due to the single crystal silicon undercut shown and described relative to FIG. 1(D)).

Figure 2C:
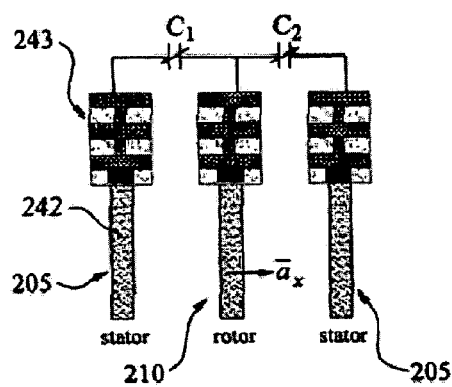
FIG. 2(C) illustrates a lateral axis comb finger sensor design, where the SCS layer is used as an active electrode, according to another embodiment of the invention.
Figure 2D:
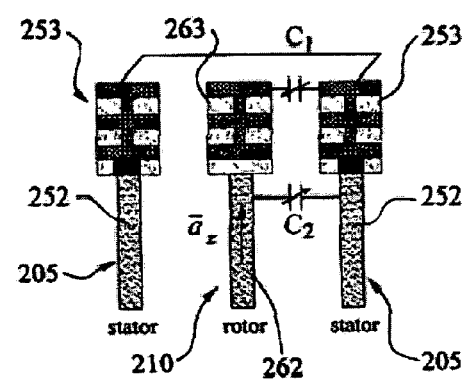
FIG. 2(D) illustrates a vertical axis comb finger sensor design, where the SCS layer is used as an active electrode, according to another embodiment of the invention.

SCS Membrane Layer as Active Electrodes (FIGS. 2(C) and (D))

In this embodiment, the SCS membrane layer 242 comprising each finger can be electrically connected to the top metal/dielectric stack 243, as shown in FIG. 2(C) for lateral-axis acceleration sensing. This is similar to the cases shown in FIGS. 2(A) and (B) where the SCS membrane layer 212 only provides mechanical support. For z-axis acceleration sensing, the SCS membrane layer 252 on the stator fingers are shown electrically connected to the respective top metal/dielectric stack 253, while the SCS layer on the rotor finger 262 is shown electrically isolated from the top metal/dielectric stack 263. Similar to FIG. 2(B), a differential capacitor pair comprising capacitors $C_1$ and $C_2$ is provided by the designs shown in FIGS. 2(C) and (D).

Figure 3A:
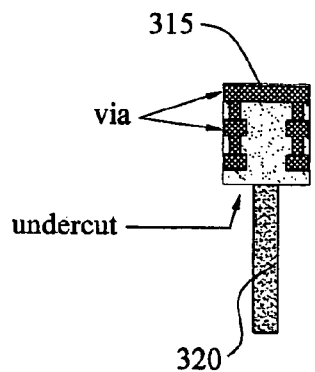
FIGS. 3(A) and (B) illustrate comb finger designs having electrodes at sidewall edges to reduce parasitic capacitance having one and two electrodes, respectively, according to embodiments of the invention.
Figure 3B:
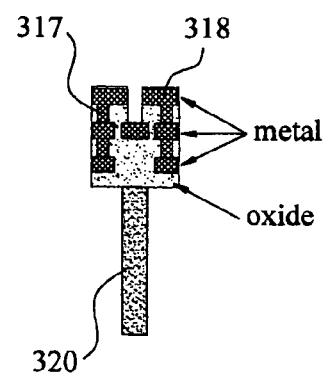
FIG. 3(C) illustrates the single electrode sidewall comb finger design of FIG. 3(A) modified to include an initial undercut of the membrane layer to further reduce parasitic capacitance, according to an embodiment of the invention.
FIG. 3(D) illustrates the two electrode sidewall comb finger designs of FIG. 3(B) modified to include an initial undercut of the membrane layer to further reduce parasitic capacitance, according to an embodiment of the invention.
Figure 3C:
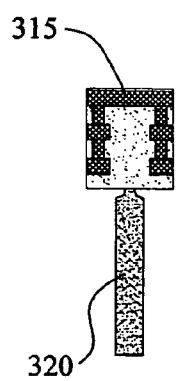
Figure 3D:
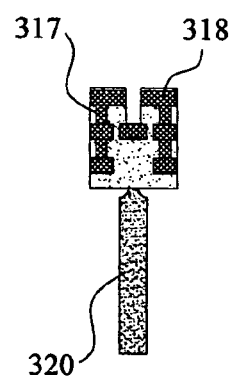

FIGS. 3(A) and 3(B) show cross-sectional views of comb fingers with single electrodes 315 and two separate electrodes 317 and 318, respectively, placed at the sidewall edges to reduce the parasitic capacitance overlap to the SCS beams 320. The parasitics can be further reduced by narrowing the SCS beams 320. The width of the SCS beams 320 is controlled by the silicon undercut step described relative to FIG. 1(D). The SCS beams 320 should not be made too narrow (~2 µm), as the mechanical robustness may become compromised. An initial silicon undercut can be used to further reduce the overlap parasitic capacitance, as shown in the single electrode embodiment shown in FIG. 3(C) and the two electrode embodiment shown in FIG. 3(D). This initial silicon undercut should be performed between the steps shown in FIG. 1(B) and FIG. 1(C).

As with conventional accelerometers, movement of comb fingers is controlled by springs. A z-axis compliant spring 410 is shown in FIG. 4(A), which can be realized by connecting multiple beams with short trusses and using beams with metal-2 or metal-3 on the top. Beams with metal-1 on the top are even more compliant in the z-direction, but they have large out-of-plane curling. Narrow beams are used in the spring to guarantee the complete undercut of silicon to form a z-compliant thin-film structure. The multiple beams with short trusses can increase the stiffness in the lateral direction to reduce cross-axis sensitivity.

Figure 4C:
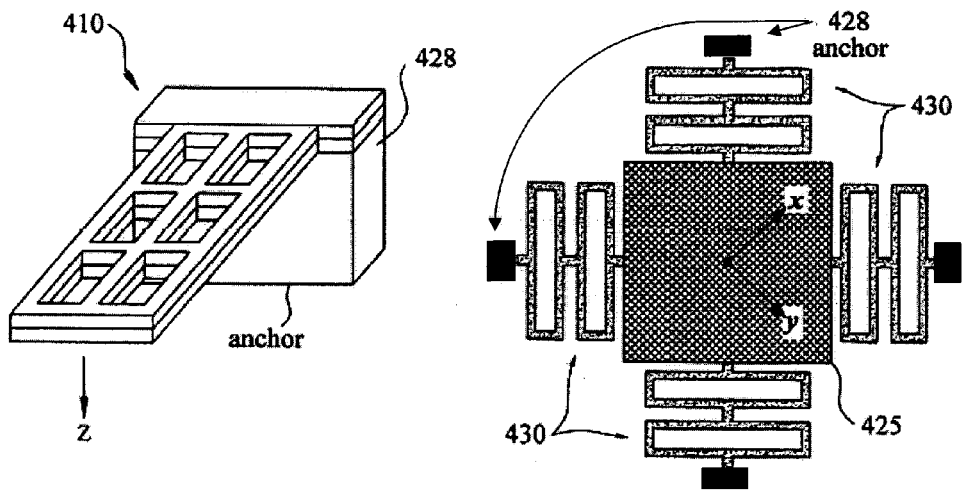
FIG. 4(C) illustrates a side view of a branch of the x-y spring shown in FIG. 4(B).
Figure 4C:
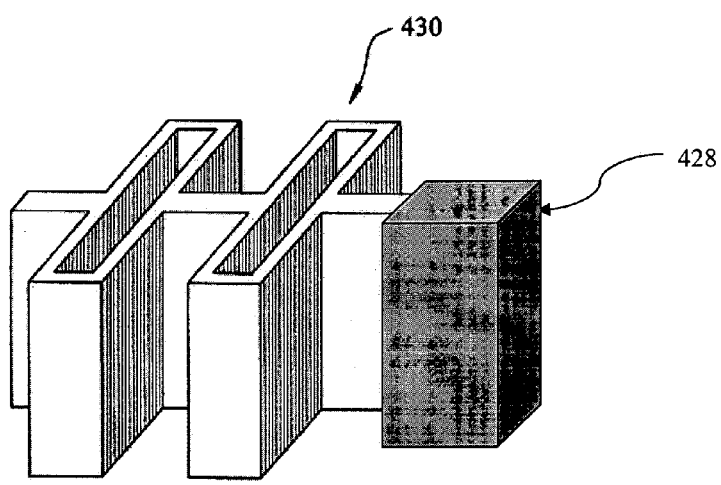

The x/y-axis spring can be obtained by symmetrically arranging four sub-springs 430 around a central plate 425 as shown in FIG. 4(B). Springs are secured using anchor 428. Each sub-spring shown consists of rectangularly closed beams in series which are flexible in both the x and y directions and anchored at a single point. The advantage of this x/y-axis spring design is that the spring constants in the x and y directions are equal. FIG. 4(C) shows a side view of one x/y spring branch 430. The torsional spring for the z-axis accelerometer shown in FIG. 5(B) and described below is constructed using a long SCS beam with a rectangular cross section.

Figure 5A:
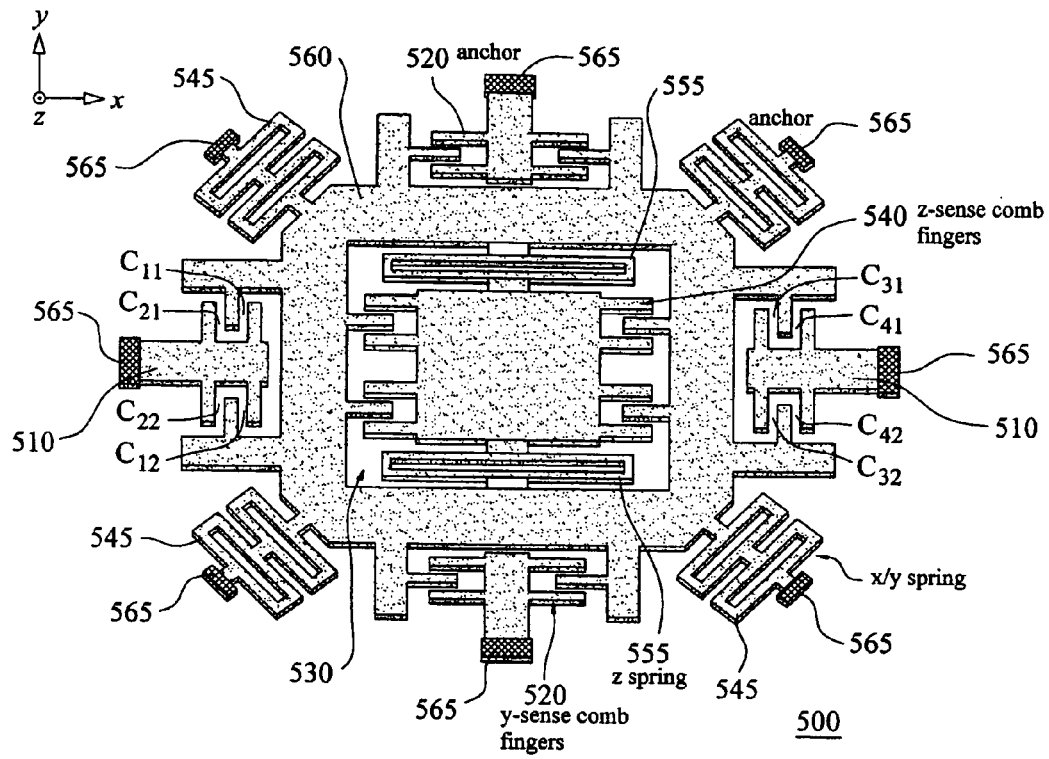
FIG. 5(A) illustrates the topology of an exemplary integrated 3-axis accelerometer, according to another embodiment of the invention.

The topology of an exemplary 3-axis accelerometer according to an embodiment of the invention 500 is show in FIG. 5(A). The comb fingers for x-axis sensing 510 form eight capacitors, i.e., four $C_i = C_{i1} + C_{i2}$, where i=1,2. Because of the symmetry, the $C_i$'s are insensitive to y-axis acceleration to first order as $C_1$ and $C_2$ form a differential capacitive divider, and so do $C_3$ and $C_4$. Thus, a full differential capacitive bridge is obtained using the four $C_i$'s. Since there is a SCS membrane (not shown) underneath spring beams for x-y springs 545, the springs are much stiffer (about two orders of magnitude) in the z-direction than in the x- or y-direction, which significantly reduces the z-axis cross-sensitivity. The same rationale applies to the y-axis acceleration sensing provided by y-axis sensing comb fingers 520. Springs 545 are secured by anchors 565.

The z-axis acceleration sensing on the 3-axis accelerometer shown in FIG. 5(A) is obtained by embedding a z-axis accelerometer 530 in the center of the structure including z-sense comb fingers 540. As shown in FIG. 5(A), the z-axis accelerometer 530 is disposed inside rigid frame 560. Frame 560 together with the z-sensing structure provided by accelerometer 530 is an effective proof mass for x-y sensing. Although not shown in FIG. 5(A), those having ordinary skill in the art will appreciate that the structure for x-y sensing can be disposed inside the frame. In this arrangement, the frame plus the x-y sensing structure is an effective proof mass for z-sensing.

The suspension of the z-axis accelerometer 530 is preferably in the form of the flexure shown in FIG. 4(A), which is flexible in the z-direction. Again, the cross-axis acceleration contributions are rejected by the differential capacitive topology. It should be noted that the differential capacitors in the z-axis accelerometer 530 are preferably stacked vertically (as shown in FIG. 2(B)) and separated into groups.

Figure 5B:
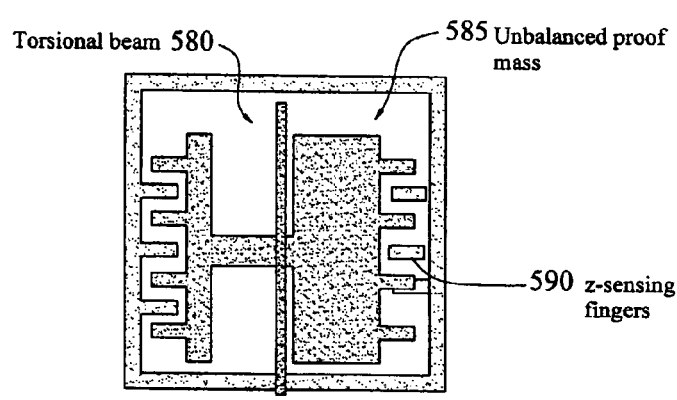
FIG. 5(B) illustrates the topology of another design for the central z-axis accelerometer, where the z-axis accelerometer includes a SCS torsional beam and a unbalanced proof mass.

FIG. 5(B) illustrates an alternate embodiment for the central z-axis accelerometer. This z-axis accelerometer design includes a SCS torsional beam (spring) 580, an unbalanced proof mass 585, and z-sense comb fingers 590. In this arrangement, z-axis acceleration will generate a torque to tilt the unbalanced proof mass 585. This tilt is proportional to the z-axis acceleration and can be detected by the same z-axis sensing comb fingers shown in FIG. 2(B). This z-axis accelerometer can directly replace the z-axis accelerometer 530 shown in FIG. 5(A) without changing anything else. The advantage of this embodiment is that the entire 3-axis accelerometer structure utilizes the SCS membrane, which results in more robust and superior temperature performance. One drawback is the non-linearity of the sensing capacitance versus the tilt. This nonlinearity may be overcome by employing closed-loop controlled force balancing.

EXEMPLARY APPLICATIONS FOR THE INVENTION:

As noted above, prior to the invention, three separate conventional single-axis accelerometers were generally required to monitor movement since acceleration is a vector quantity. Although single-axis accelerometers are typically small, assembling three single-axis accelerometers significantly increases the package size and cost. Therefore, integrated 3-axis accelerometers disclosed herein are much better suited for many accelerometer-related applications, particularly for such applications requiring small size, low power, low cost and high resolution.

In some applications, single-point acceleration detection may be not sufficient. For instance, if a given application requires simultaneous knowledge of the movement of head, arms, and legs of an individual, small size is even more crucial. The compact size and low cost of the monolithic 3-axis accelerometer thus makes systems according to the invention attractive to a wide variety of applications.

In one application, the impact on a football player's head can be real-time monitored by placing monolithic 3-axis accelerometers in the helmet. In a preferred embodiment as noted above, the monolithic 3-axis accelerometer-based system includes a wireless transmitter and on-chip signal processing, such as on the same monolithic chip, for transmitting the acceleration data to one or more remotely located monitoring stations. Thus, a football player can be warned of possible head injuries when measured accelerations are sensed as being above a certain predetermined threshold value. The data obtained can also help coaches in training and help helmet manufacturers to make better helmets to avoid head injuries. Although three (3) conventional accelerometers can generally be used for this particular application, as noted above assembling the three (3) single-axis accelerometers drastically increases the cost and size.

Although the overall size of three (3) conventional accelerometers may be suitable for a football player's helmet, it may be too large for other applications such as activity monitoring for babies and the elderly. Wireless monolithic 3-axis accelerometer-based systems according to the invention are adapted to be worn because of their small size, low power and wireless communication capability. The recorded movement data can be transmitted to a remotely located sight, such as a base station or directly to a doctor's office through a wireless network. Applications for wireless monolithic 3-axis accelerometer-based systems according to the invention include the following:

1. Motion monitoring for rehabilitation of patients.
2. Physical activity monitoring for athletes, babies and elderly.
3. Motion monitoring for identifying the pain sources of injured large animals.

In the above exemplary applications, the sensors must be wearable. Accordingly, the sensors must be small, low power and wireless. As noted above, each of these required features are provided by sensors according to the invention.

The same concept can be applied to civilian infrastructure monitoring and protection. Vibration monitoring for civilian infrastructures, such as bridges and buildings, can detect potential mechanical failures. Wireless sensor networks can be placed in skyscrapers. When extreme events such as earthquake, hurricane or terror attack occur, the sensor network can provide damage information at different locations of a skyscraper which can guide people inside the building to escape and help locate and rescue trapped survivors. The wireless sensors can also be disposed in a battlefield or a forest to monitor an enemy's activities. Oil exploration is another potential application, where oil sources can be identified by measuring the impact wave propagation in a field. In this application, a vibration wireless sensor network with high sensitivity and low power is a very effective and inexpensive solution.

Consumer electronics and automotives are also applications for the invention. For example, the vibration control of CD holders, airbags for collision protection and image stabilization are also demanding small-size, low-power and low-cost vibration sensors.

Three-axis accelerometers can be combined with gyroscopes can be used for navigation control for space and military applications. The portable navigation units are extremely useful for soldiers in a battlefield to accurately position themselves even when the GPS signal is jammed or not available.

EXAMPLES

The present invention is further illustrated by the following Examples. The examples are provided for illustration only and are not to be construed as limiting the scope or content of the invention in any way.

Example 1

Structural Simulation

A structural simulation of a monolithic integrated three axis accelerometer according to an embodiment of the invention was performed using Nodal Design of Actuators and Sensors (NODAS) software. NODAS is a hierarchical cell library for behavioral modeling and nodal simulation of MEMS, was used [Q. Jing and G. K. Fedder, "A hierarchical circuit-level design methodology for microelectromechanical systems," IEEE Transactions on Circuits and Systems II, Vol. 46 (1999), pp. 1309-1315]. NODAS consists of symbols and models of elements commonly found in suspended MEMS designs, such as anchors, beams, plates and gaps. As shown in FIGS. 2(A) and 2(B), the cross-section of the DRIE beams is not rectangular. A DRIE beam has a wider CMOS layer on top of the silicon layer. This irregular cross section has been considered and adopted in the DRIE beam model in the NODAS library.

Figure 6A:
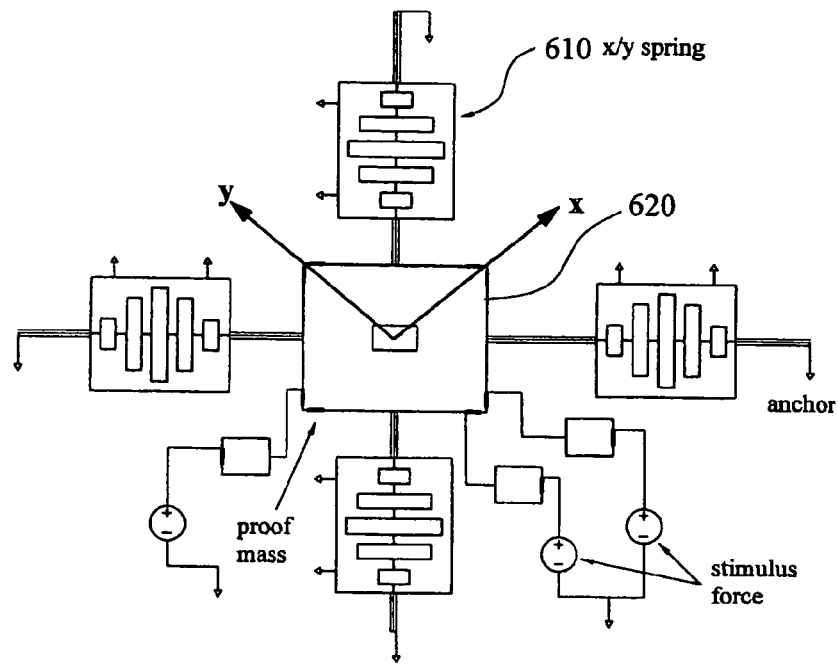
FIG. 6(A) illustrates a NODAS model for an x-y accelerometer according to an embodiment of the invention where the plate represents the proof of mass.

FIG. 6(A) shows the NODAS model for an x-y accelerometer which includes x/y springs 610 and proof mass 620. A plate represents the proof mass 620. Each x-y spring 610 consists of a group of beams. Note that the model shown in FIG. 6 was rotated 45 degrees compared to structure shown in FIG. 5(A).

Figure 6B:
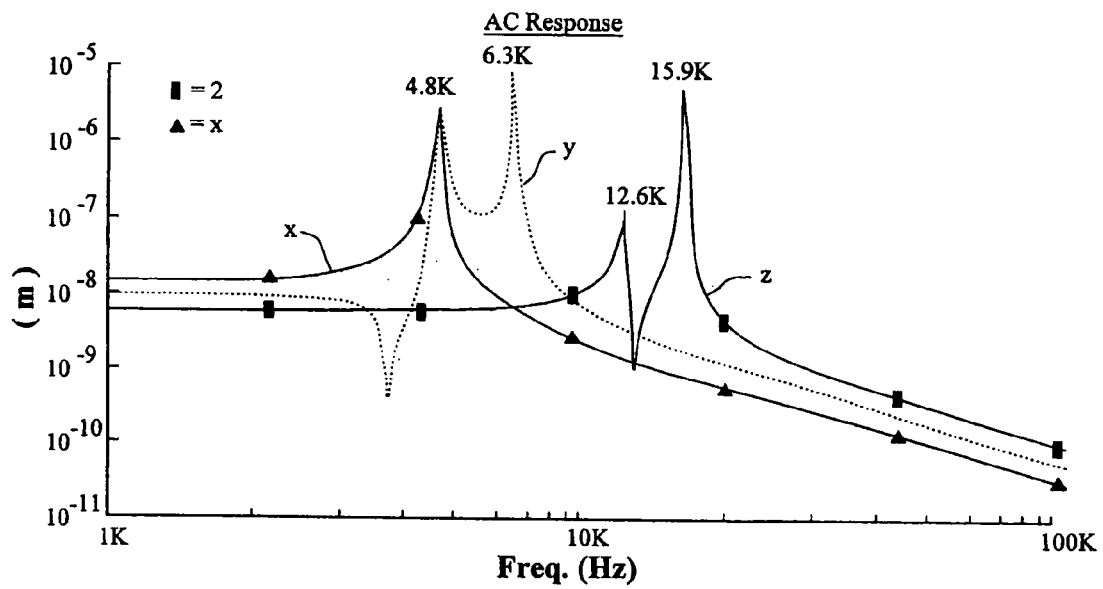
FIG. 6(B) illustrates a NODAS simulation derived AC response for a three axis accelerometer according to an embodiment of the invention.

The simulation results obtained are plotted in FIG. 6(B). Table 1 below lists the design parameters for the 3-axis accelerometer simulated. The symmetry of the x/y springs 610 gives the same first resonance (4.8 kHz) for both x- and y-axes. A torsional force was also applied with respect to the y-axis which gives a 6.3 kHz torsional mode. The z-stiffness in the x/y springs is much larger because of the thick silicon layer. A 15.9 kHz resonance along the z-axis was obtained from the simulation. A similar NODAS model was used for an embedded z-axis accelerometer, in which the z-axis resonance was found to be at 4.2 kHz.

TABLE 1

Design parameters for the exemplary 3-axis accelerometer

|  | X | Y | Z |
| --- | --- | --- | --- |
| Proof mass (μg) | 73 | 73 | 40 |
| Resonance (kHz) | 4.8 | 4.8 | 4.2 |

Example 2

Fabrication Results

A released exemplary monolithic integrated three axis accelerometer 700 according to an embodiment of the invention is shown in FIG. 7(A) comprising x-sensing accelerometer 710, y-axis accelerometer 720 and z-axis accelerometer 730, all disposed on the same chip. The x-axis accelerometer 710 y-axis accelerometer 720 are identical and orthogonally oriented, while the z-accelerometer 730 is embedded in the center of accelerometer 700. The entire microstructure shown is about 1 mm by 1 mm in size. The SCS membrane layer was about 60 μm thick. Silicon underneath the z-spring beams 740 was completely undercut to maximize the z-compliance. Silicon underneath the x/y-spring beams 750 was just partially undercut to maintain the flatness of the whole structure. The silicon undercut on the comb fingers with small gaps was significantly reduced because of the known microloading effect.

Figure 8:
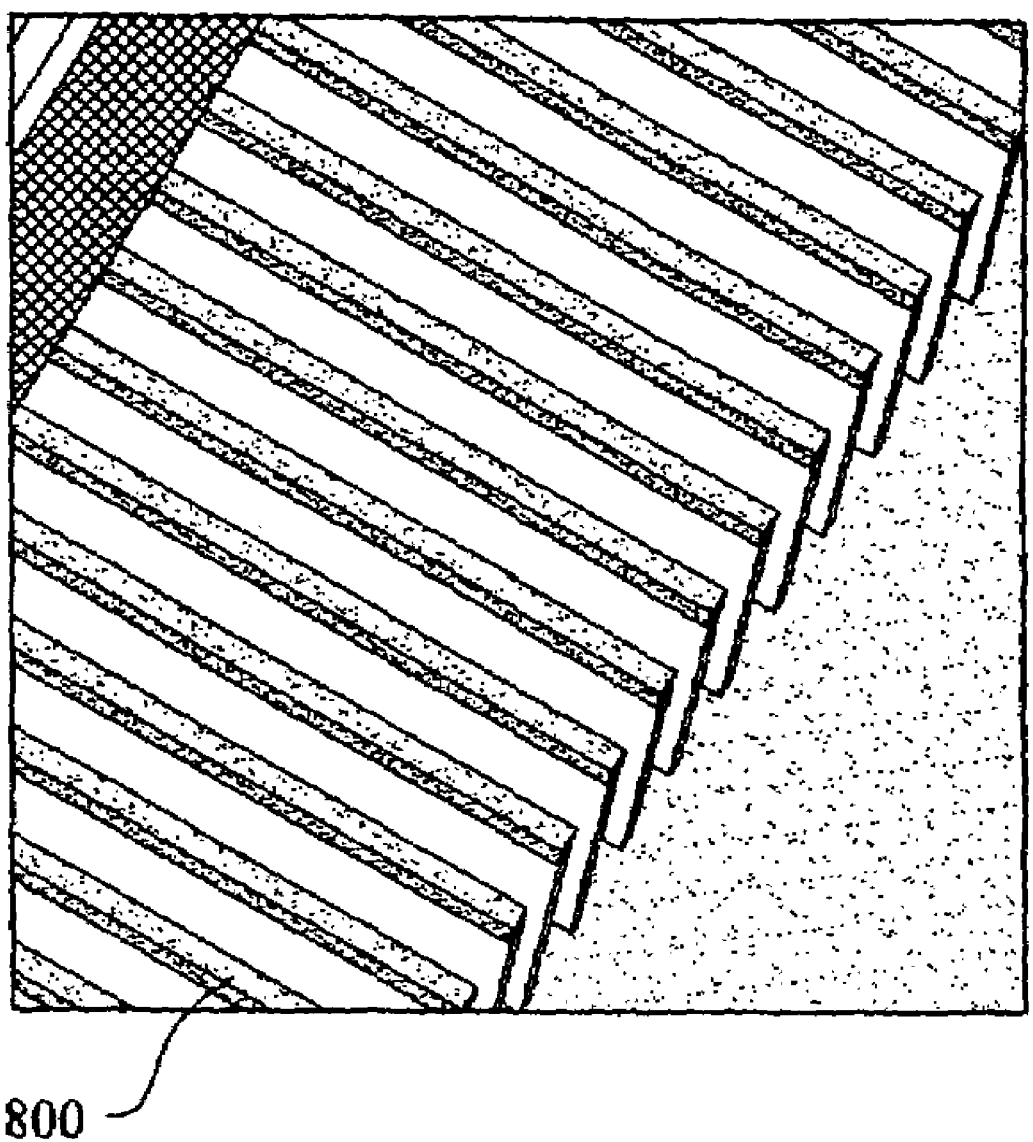
FIG. 8 is a SEM showing a plurality of comb fingers according to an embodiment of the invention.

FIG. 7(B) shows a micrograph of an x/y spring 750, while FIG. 7(C) shows a micrograph of y-axis accelerometer 720 and its associated y-sensing comb fingers 725. A SEM showing exemplary comb fingers 800 with one side stripped off is shown in FIG. 8.

It is to be understood that while the invention has been described in conjunction with the preferred specific embodiments thereof, that the foregoing description as well as the examples which follow are intended to illustrate and not limit the scope of the invention. Other aspects, advantages and modifications within the scope of the invention will be apparent to those skilled in the art to which the invention pertains.

I claim:

1. A monolithic integrated 3-axis accelerometer chip, comprising:
    a single crystal substrate, said single crystal substrate including at least one single crystal membrane layer portion;
    a single microstructure formed using said membrane layer, said single microstructure capacitively sensing and providing acceleration data for all three orthogonal axes, wherein said single microstructure comprises a plurality of comb finger sets including at least one comb finger set for motion sensing in each of said three orthogonal axes, said comb finger sets comprising a plurality of comb fingers, said comb finger sets for each of said three orthogonal axes include said membrane layer, and
    at least one electronic circuit formed on said single crystal substrate for processing said acceleration data.

2. The accelerometer of claim 1, wherein said single crystal substrate is preferably single crystal silicon, and said electronic circuit is preferably a CMOS circuit.

3. The accelerometer of claim 1, wherein said electronic circuit comprises at least one selected from the group consisting of a pre-amplifier, a demodulator, a low-pass filter, an A/D converter and a DSP.

4. The accelerometer of claim 1, wherein said accelerometer includes a proof mass and at least one flexure, at least a portion of said comb fingers being disposed on said proof mass, said flexure mechanically connecting said proof mass and said membrane layer.

5. The accelerometer of claim 1, wherein said plurality of comb finger sets comprise a metal/dielectric composite thin film layer stack disposed on said membrane layer.

6. The accelerometer of claim 5, wherein said metal in said metal/dielectric stack is electrically isolated from said membrane layer.

7. The accelerometer of claim 5, wherein said metal in said metal/dielectric stack is electrically connected to said membrane layer, said membrane layer comprising at least one electrode of said structure for differential capacitive sensing.

8. The accelerometer of claim 5, wherein said metal in said metal/dielectric stack is disposed in sidewalls of said metal/dielectric stack.

9. The accelerometer of claim 5, wherein a cross sectional area of said membrane layer is less than a cross sectional area of said metal/dielectric stack.

10. The accelerometer of claim 9, wherein said cross sectional area of said membrane layer is less than a cross sectional area of said metal/dielectric stack for said comb fingers including comb fingers which provide z-axis sensing.

11. The accelerometer of claim 1, wherein said accelerometer includes a rigid frame disposed between structure for x-y sensing and structure for z-sensing.

12. The accelerometer of claim 11, wherein said structure for z-sensing is disposed inside said rigid frame, wherein said structure for z-sensing includes a proof mass disposed inside said rigid frame by at least one element for decoupling z-sensing from x-y sensing, wherein said frame plus said z-sensing structure is an effective proof mass for said structure for x-y sensing.

* * * * *